（12） United States Patent
Shim et al.

(10) Patent No.: US 7,923,989 B2
(45) Date of Patent: Apr. 12, 2011

(54) TEST HANDLER

(75) Inventors: Jae Gyun Shim, Suwon-si (KR); Yun Sung Na, Cheonan-si (KR); In Gu Jeon, Suwon-si (KR); Tae Hung Ku, Suwon-si (KR); Dong Han Kim, Suwon-si (KR)

(73) Assignee: Techwing Co., Ltd. (KR)

( * ) Notice: Subject to any disclaimer, the term of this patent is extended or adjusted under 35 U.S.C. 154(b) by 59 days.

(21) Appl. No.: 12/170,680

(22) Filed: Jul. 10, 2008

(65) Prior Publication Data

US 2008/0265874 A1  Oct. 30, 2008

Related U.S. Application Data

(63) Continuation of application No. PCT/KR2007/000371, filed on Jan. 22, 2007.

(30) Foreign Application Priority Data

Jan. 23, 2006 (KR) .................. 10-2006-0006842

(51) Int. Cl.
*G01R 31/28* (2006.01)
(52) U.S. Cl. .................................. 324/158.1
(58) Field of Classification Search ............ None
See application file for complete search history.

(56) References Cited

U.S. PATENT DOCUMENTS

| 5,227,717 | A | 7/1993 | Tsurishima et al. |
| 6,925,706 | B2 * | 8/2005 | Hwang ................ 29/740 |
| 7,235,964 | B2 * | 6/2007 | Mueller .............. 324/158.1 |
| 2006/0214655 | A1 * | 9/2006 | Ham et al. ............. 324/158.1 |

FOREIGN PATENT DOCUMENTS

| KR | 2000-0003128 | 1/2000 |
| KR | 2003-0009874 | 2/2003 |

* cited by examiner

*Primary Examiner* — Roberto Velez
(74) *Attorney, Agent, or Firm* — BainwoodHuang

(57) ABSTRACT

A test handler includes a loading unit for loading semiconductor devices from customer trays onto a test tray; a test chamber for performing a test for the semiconductor devices loaded on the test tray; a pushing unit having at least one pushing member for pushing the test tray located in the test chamber to be tested, and a press unit for operating the pushing member; a position control unit for adjusting a position of the pushing member to compensate a deviation between the pushing member and the test tray due to a thermal expansion or contraction of any one of the pushing member and the test tray; and an unloading unit for unloading the semiconductor devices loaded on the test tray onto the customer trays after a test for the semiconductor devices is completed.

6 Claims, 15 Drawing Sheets

TEST HANDLER

This application is a Continuation Application of PCT International Application No. PCT/KR2007/000371 filed on Jan. 22, 2007, which designated the United States.

FIELD OF THE INVENTION

The present invention relates to a test handler.

BACKGROUND OF THE INVENTION

In general, a test handler is an apparatus for supporting a tester for testing semiconductor devices fabricated through a preset manufacturing process. The test handler classifies the fabricated semiconductor devices into several classes according to their test results and serves to unload those classified semiconductor devices onto customer trays. Such a test hander has been already known through various published documents.

FIG. 1 shows a schematic perspective view of a conventional test hander 100, and FIG. 2 sets forth a conceptual top view showing major components of the test handler 100. Below, the major components of the conventional test handler 100 will be described schematically with reference to FIGS. 1 and 2. Referring to FIG. 1, the conventional test handler 100 includes a loading unit 110, a soak chamber 120, a test chamber 130, a desoak chamber 140, an unloading unit 150 and a pushing unit 160. Further, as shown in FIG. 2, disposed behind the test chamber 130 is a tester 170 for testing semiconductor devices placed on a test tray in the test chamber 130.

The loading unit 110 transfers and loads semiconductor devices from customer trays 10a onto the test tray.

After completing the loading of the semiconductor devices on the test tray by means of the loading unit 110, the soak chamber 120 accommodates the test tray therein. The soak chamber 120 has a temperature environment for pre-heating or pre-cooling the semiconductor devices loaded on the test tray. The test tray introduced into the soak chamber 120 is translated toward the test chamber 130 while being vertically maintained. During the time period when the test tray is translated, the semiconductor devices loaded on the test tray are pre-heated or pre-cooled sufficiently.

The test chamber 130 is installed to test the semiconductor devices loaded on two test trays 11a and 11b provided from the soak chamber 120. For the purpose, the test chamber 130 has a temperature environment adequate for testing of the semiconductor devices.

The desoak chamber (so called a recovery chamber) 140 is installed to return the temperature of the heated or cooled semiconductor devices to the room temperature. The unloading unit 150 classifies the semiconductor devices on the test tray that is provided thereto via the desoak chamber 140, and it transfers and loads the classified semiconductor devices onto the customer trays 10b.

The pushing unit 160 pushes the test trays 11a and 11b toward the tester 170.

Meanwhile, the tester 170 configured to correspond to the test handler 100 is disposed behind the test chamber 130, and it tests the semiconductor devices loaded on the test trays 11a and 11b vertically arranged in two levels in the test chamber 130.

FIG. 3 is a schematic view of the tester 170. As shown in FIG. 3, the tester 170 includes Hi-Fix boards 171a and 171b each having a number of test sockets 171-1 arranged in a matrix pattern; a test head 172; and so forth. Recently, in a test handler in general, two test trays are disposed at an upper and a lower part of a test chamber to test all the semiconductor devices loaded on the two test trays at one time by using a single tester, for the purpose of increasing a throughput. Accordingly, the tester 170 has a configuration in which the two Hi-Fix boards 171a and 171b are vertically arranged in two levels on the single test head 172, and each of the Hi-Fix boards 171a and 171b is configured to correspond to one of the test trays 11a and 11b, respectively.

FIG. 4 is a perspective view of a test tray 11. The test tray 11 includes a number of inserts 11-1 arranged in a matrix pattern to correspond to the test sockets 171-1 disposed in the matrix pattern; a frame 11-2 for supporting the inserts 11-1; and so forth. The inserts 11-1 are supported on the frame 11-2, wherein preset intervals are maintained between the inserts 11-1 in all directions.

In the above configuration, the testing of the semiconductor devices held by the inserts 11-1 of the test tray 11 can be conducted by bringing the semiconductor devices into firm contact with the test sockets 171-1 (see Korean Patent Publication No. 2000-0003128). Accordingly, the test handler 100 needs to have the pushing unit 160 for pushing the test trays 11a and 11b to the tester 170 in order to allow the semiconductor devices, which are held by the inserts 11-1 on the test trays 11a and 11b in the test chamber 130, to contact with the test sockets 171-1.

FIG. 5 is an exploded perspective view of the pushing unit 160 in accordance with the prior art. The pushing unit 160 includes a press unit 161, a plurality of guide rails 162a to 162c, match plates 163a and 163b, and so forth.

The press unit 161 has a duct 161a and a cylinder 161b for moving the duct 161a back and forth.

The guide rails 162a to 162c are fixed at an upper end portion, a middle portion and a lower end portion of the duct 161a, respectively, via screws or the like. The upper guide rail 162a is provided with a rail groove 162a-1 at a lower surface thereof; the middle guide rail 162b is provided with a rail groove 162b-1 and a rail groove 162b-2 at an upper and a lower surface thereof, respectively; and the lower guide rail 162c is provided with a rail groove 162c-1 at an upper surface thereof. The match plates 163a and 163b are installed to the guide rails 162a to 162c.

The match plates 163a and 163b have a number of protuberant pushers 163-1 arranged in a matrix pattern to correspond to the inserts 11-1 arranged in the matrix pattern on the test trays 11a and 11b. By being supported by the guide rails 162a to 162c, the match plates 163a and 163b are fastened to the duct 161a. The match plates 163a and 163b are installed by being guided on the rail grooves 162a-1, 162b-1, 162b-2 and 162c-1, which are formed on the guide rails 162a to 162c, from the lateral side of the duct 161a.

FIG. 6 is a side view showing a configuration in which the match plates 163a and 163b are installed to the guide rails 162a to 162c. Referring to A, B, and C portions of FIG. 6, the lower ends of the match plates 163a and 163b are configured to contact the bottom surfaces of the rail grooves 162b-1 and 162c-1 formed at the guide rails 162b and 162c, respectively, whereas certain gaps are maintained between the upper ends of the match plates 163a and 163b and the rail grooves 162a-1 and 162b-2, respectively. The gaps are provided by considering thermal expansions or contractions of the match plates 163a and 163b that may occur depending on a temperature condition within the test chamber 130.

Meanwhile, in order to allow the semiconductor devices loaded in the inserts 11-1 to be appropriately contacted with the test sockets 171-1 such that a test of the semiconductor devices can be conducted, it is required to perform a step of pushing the test trays 11a and 11b toward the tester 170 side after the match plates 163a and 163b come into firm contact with the test trays 11a and 11b, thus allowing the semiconductor devices loaded in the inserts 11 to be contacted with the test sockets 171-1. To perform such step, mechanical configurations as follows are required. The configurations will be described with reference to FIG. 7.

FIG. 7 illustrates a pusher 163-1 of the match plates 163a and 163b, an insert 11-1 of the test trays 11a and 11b, and a test socket 171-1 of the Hi-Fix boards 171a and 171b in detail.

As shown in FIG. 7, the pusher 163-1 has two pusher protrusions 163-11 for guiding an appropriate insertion of the pusher 163-1 with the insert 11-1, and the insert 11-1 is provided with two protrusion holes 11-11 for allowing the pusher protrusions 163-11 to be inserted therethrough. Here, the inner diameter of the protrusion holes 11-11 is set to be larger than the outer diameter of the pusher protrusions 163-11 in order to allow the pusher 163-1 and the insert 11-1 to appropriately contact with each other even in case the match plates 163a and 163b and the test trays 11a and 11b suffer a change in their relative sizes as a result of their thermal expansions or contractions.

Further, as illustrated in FIG. 7, the test socket 171-1 has two socket guiders 171-11 of a protrusion shape, and the insert 11-1 is provided with two guide holes 11-12 into which the socket guider 171-11 is to be firmly inserted. In such configuration, when the match plates 163a and 163b operate to push the test trays 11a and 11b toward the tester 170, the pusher protrusions 163-11 are first inserted into the protrusion holes 11-11, thus guiding the pusher 163-1 to contact with the insert 11-1. Then, the socket guiders 171-11 are inserted into the guide holes 11-12, thus guiding a semiconductor device loaded in the insert 11-1 to be contacted with the test socket 171-1.

In the above conventional configuration, however, as the sizes of the match plates 163a and 163b and the test trays 11a and 11b are changed due to their thermal expansions or contractions, an appropriate contact therebetween might not be achieved. That is, given that the test chamber 130 has a poor temperature environment (ranging from about −35 to 130 degrees) to test the semiconductor devices, the test trays 11a and 11b and the match plates 163a and 163b are subjected to thermal expansion or contraction. In contrast, as for the Hi-Fix boards 171a and 171b made up of an epoxy material, they experience little thermal expansion or contraction in comparison with the test trays 11a and 11b and the match plates 163a and 163b. The thermal expansion or contraction of the match plates 163a and 163b or the test trays 11a and 11b may cause many problems, which will be explained as follows.

In general, the match plates 163a and 163b and the frames 11-2 of the test trays 11a and 11b are made up of metal materials. The match plates 163a and 163b and the frames 11-2 of the test trays 11a and 11b may be formed of the same metal material or different metal materials. In contrast, the Hi-Fix boards 171a and 171b are formed of an epoxy material, so that it can be assumed that the Hi-Fix boards 171a and 171b hardly suffer a thermal expansion or contraction in comparison with the match plates 163a and 163b or the test trays 11a and 11b.

If the match plates 163a and 163b and the frames 11-2 of the test trays 11a and 11b are made up of the same metal material or if a difference in the degrees of their thermal expansions or contractions is relatively small so that the pusher protrusions 163-11 can be still inserted into the protrusion holes 11-11 appropriately, and if the Hi-Fix boards 171-11 hardly suffers a thermal deformation, the pushers 163-1 can appropriately contact with the inserts 11-1. However, even in such case, the guide holes 11-12 of the inserts 11-1 and the socket guiders 171-11 might be mismatched as a result of the thermal expansions or contractions of the match plates 163a and 163b and the test trays 11a and 11b. In general, since the lower ends of the match plates 163a and 163b are supported by the guide rails 162b and 162c, and the lower ends of the test trays 163a and 163b are supported by move rails (not shown), those thermal expansions or contractions cause changes in the positions of the upper ends of the match plates 163a and 163b and the test trays 11a and 11b. Accordingly, the pushers 163-1 located at upper portions of the match plates 163a and 163b and the inserts 11-1 located at upper portions of the test trays 11a and 11b may suffer a greater variation in their locations, i.e., a greater deviation in their locations, so that mismatches may be caused between the guide holes 11-12 of the inserts 11-1 provided at the upper positions of the test trays 11a and 11b and the socket guiders 171-11 of the test sockets 171-1 provided at the upper positions of the Hi-Fix boards 171a and 171b, as shown in FIG. 8, resulting in damages of the inserts 11-1 or failures of the test sockets 171-1 during the pushing operation.

Meanwhile, it is also possible to consider a condition where the degrees of the thermal expansions or contractions of the match plates 163a and 163b and the test trays 11a and 11b are different, and a mismatch occurs between the pusher protrusions 163-11 provided at the upper portions of the match plates 163a and 163b and the protrusion holes 11-11 provided at the upper portions of the test trays 11a and 11b so that the pusher protrusions 163-11 cannot be inserted into the protrusion holes 11-11, which results in a failure to firmly adhere the match plates 163a and 163b to the test trays 11a and 11b.

FIG. 9 shows an example where the match plates 163a and 163b cannot be firmly adhered to the test trays 11a and 11b by assuming that the test trays 11a and 11b are made up of a material which does not suffer a thermal expansion or contraction while the match plates 163a and 163b are made up of a material suffering a great thermal expansion or contraction. In the case of FIG. 9, before the semiconductor devices loaded in the inserts 11-1 and the test sockets 171-1 come into appropriate contact with each other, there occurs a mismatch problem between the pushers 163-1 disposed at the upper portions of the match plates 163a and 163b and the inserts 11-1 disposed at the upper portions of the test trays 11a and 11b. As a result, the semiconductor devices loaded in the inserts 11-1 and the test sockets 171-1 cannot contact appropriately.

Besides, when considering the recent trend for the development of the test handler that the sizes of the test tray is increased to test more semiconductor devices at one time, the above-cited problem relevant to thermal expansion or contraction would become an even more serious problem yet to be solved.

SUMMARY OF THE INVENTION

It is, therefore, an object of the present invention to provide a technology capable of compensating a deviation between test trays and match plates resulted from their thermal expansions or contractions, thus allowing semiconductor devices held by the test trays to be appropriately connected with test sockets of a tester regardless of the thermal expansions or contractions of the test trays and the match plates.

In accordance with a first embodiment of the present invention, there is provided a test handler including: a loading unit for loading semiconductor devices from customer trays onto a test tray; a test chamber for performing a test for the semiconductor devices loaded on the test tray; a pushing unit having at least one pushing member for pushing the test tray located in the test chamber, and a press unit for operating the pushing member; a position control unit for adjusting a position of the pushing member to compensate a deviation between the pushing member and the test tray due to a thermal expansion or contraction of any one of the pushing member and the test tray; and an unloading unit for unloading the semiconductor devices loaded on the test tray onto the customer trays after a test for the semiconductor devices is completed.

In accordance with a second embodiment of the present invention, there is provided a test handler including: a loading unit for loading semiconductor devices from customer trays onto a test tray; a test chamber for performing a test for the semiconductor device loaded on the test tray; a pushing unit having at least one pushing member for pushing the test tray located in the test chamber to be tested; a position control unit for adjusting a position of the test tray to compensate a deviation between the pushing member and the test tray resulted from a thermal expansion or contraction of any one of the pushing member and the test tray; and an unloading unit for unloading the semiconductor devices loaded on the test tray onto the customers tray after a test of the semiconductor devices is completed.

According to the present invention, by adjusting the positions of at least one of the test trays or the match plates, an appropriate connection between the semiconductor devices held by the test trays and the test sockets of the Hi-Fix boards can be achieved.

BRIEF DESCRIPTION OF THE DRAWINGS

The above and other objects and features of the present invention will become apparent from the following description of embodiments given in conjunction with the accompanying drawings, in which.

DETAILED DESCRIPTION OF THE EMBODIMENTS

Figure 1:
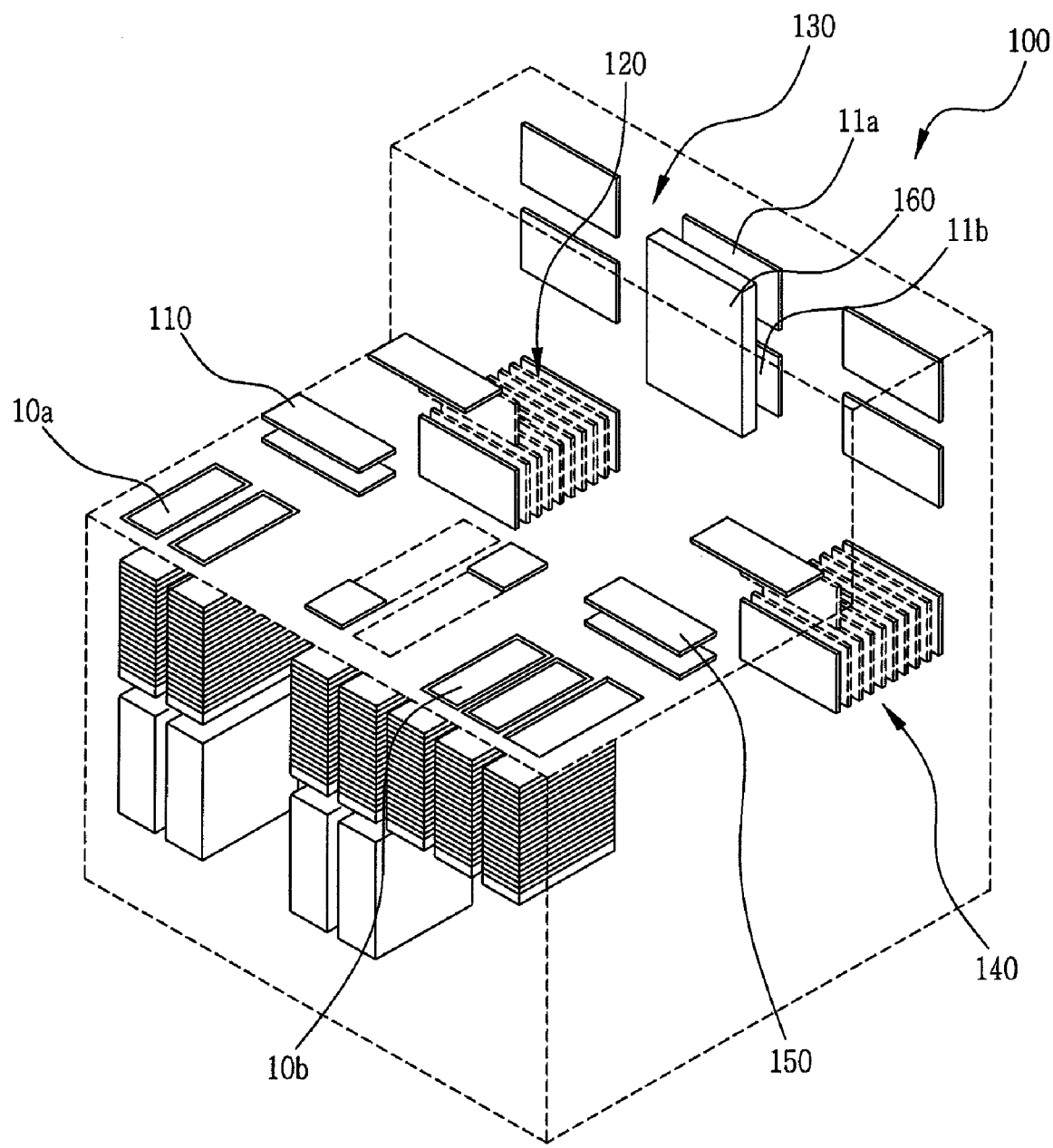
FIG. 1 is a schematic perspective view of a conventional test handler.
Figure 2:
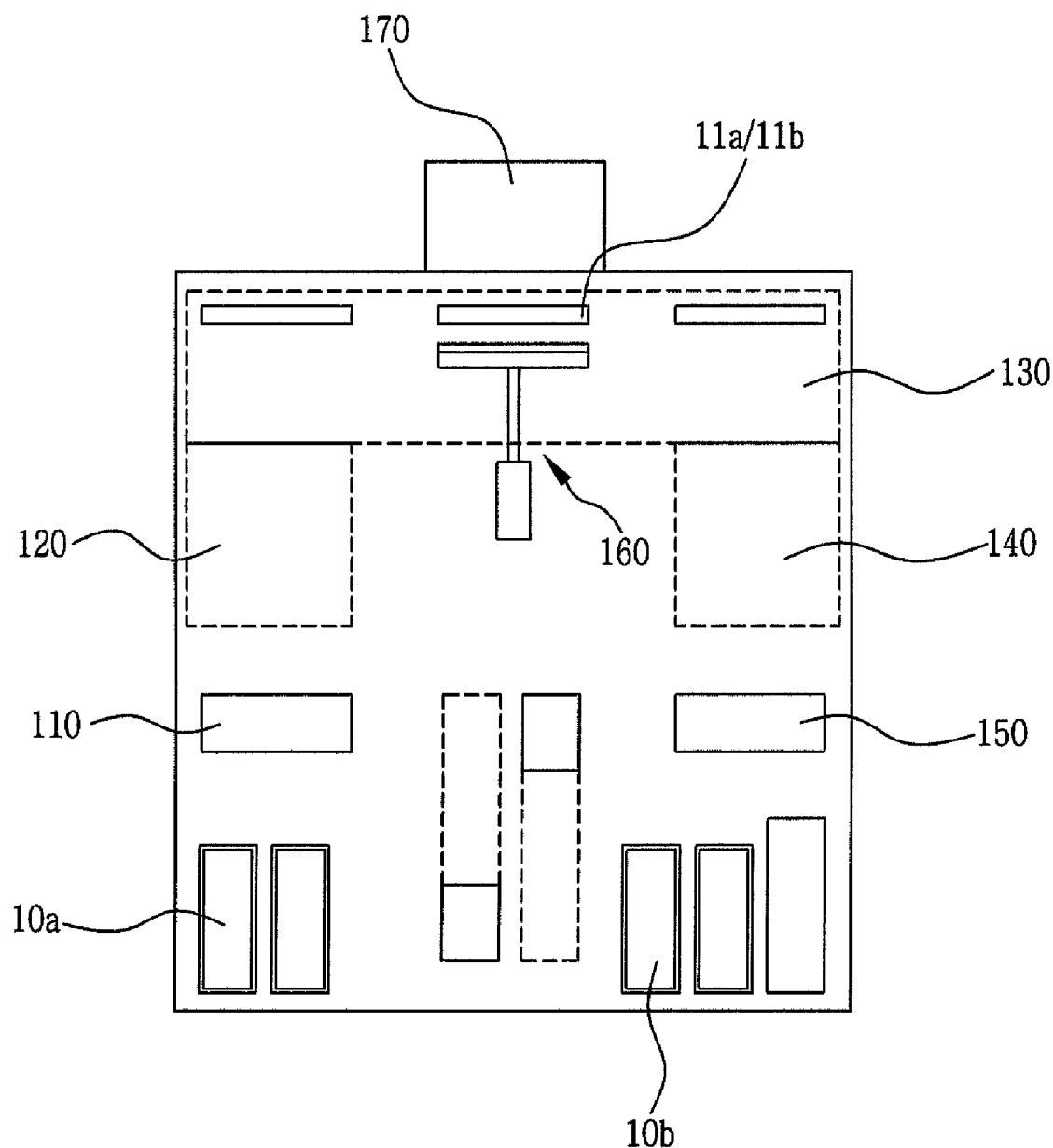
FIG. 2 sets forth a conceptual top view showing major components of the test handler of FIG. 1.
Figure 3:
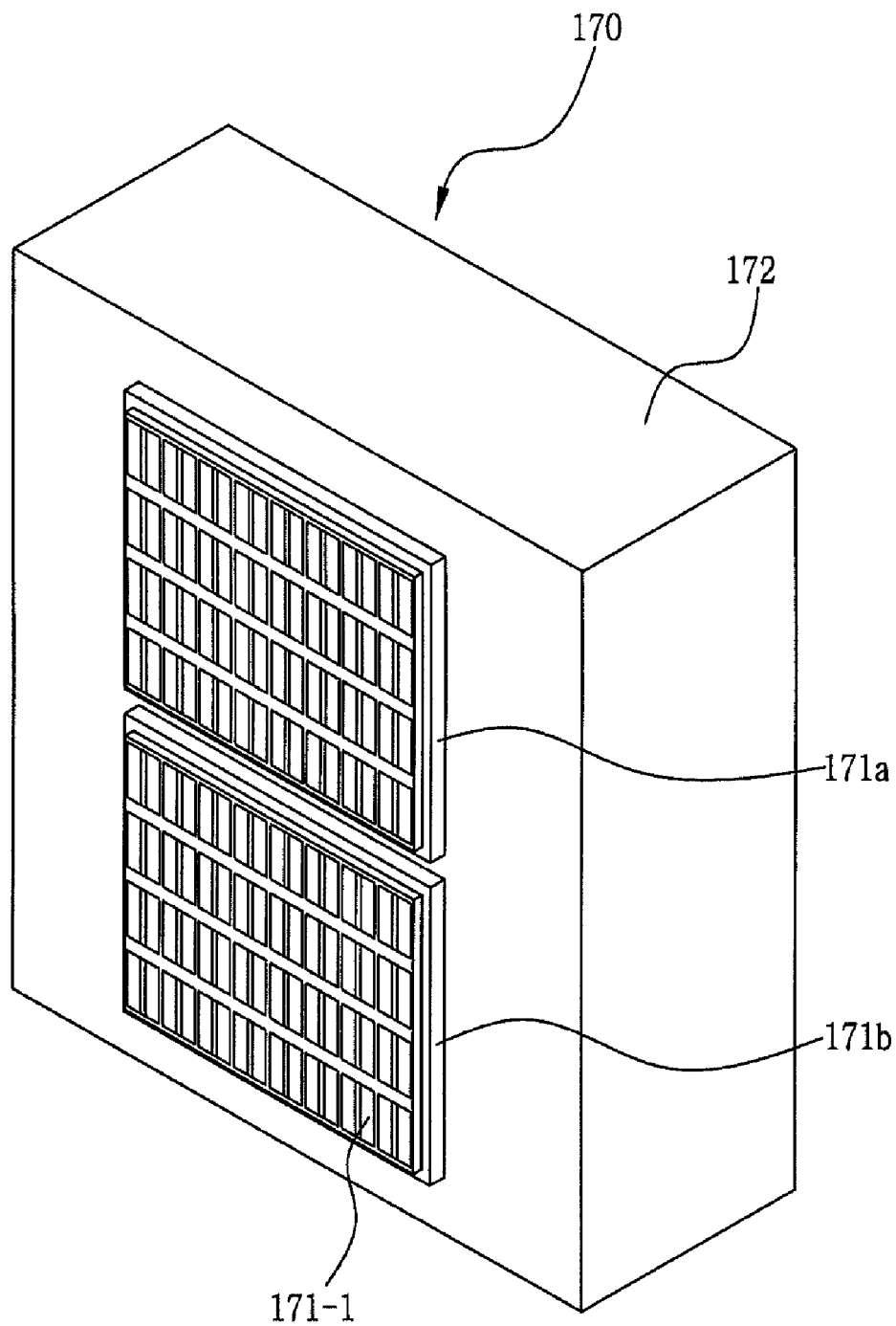
FIG. 3 provides a schematic perspective view of a tester corresponding to the test handler of FIG. 1.
Figure 4:
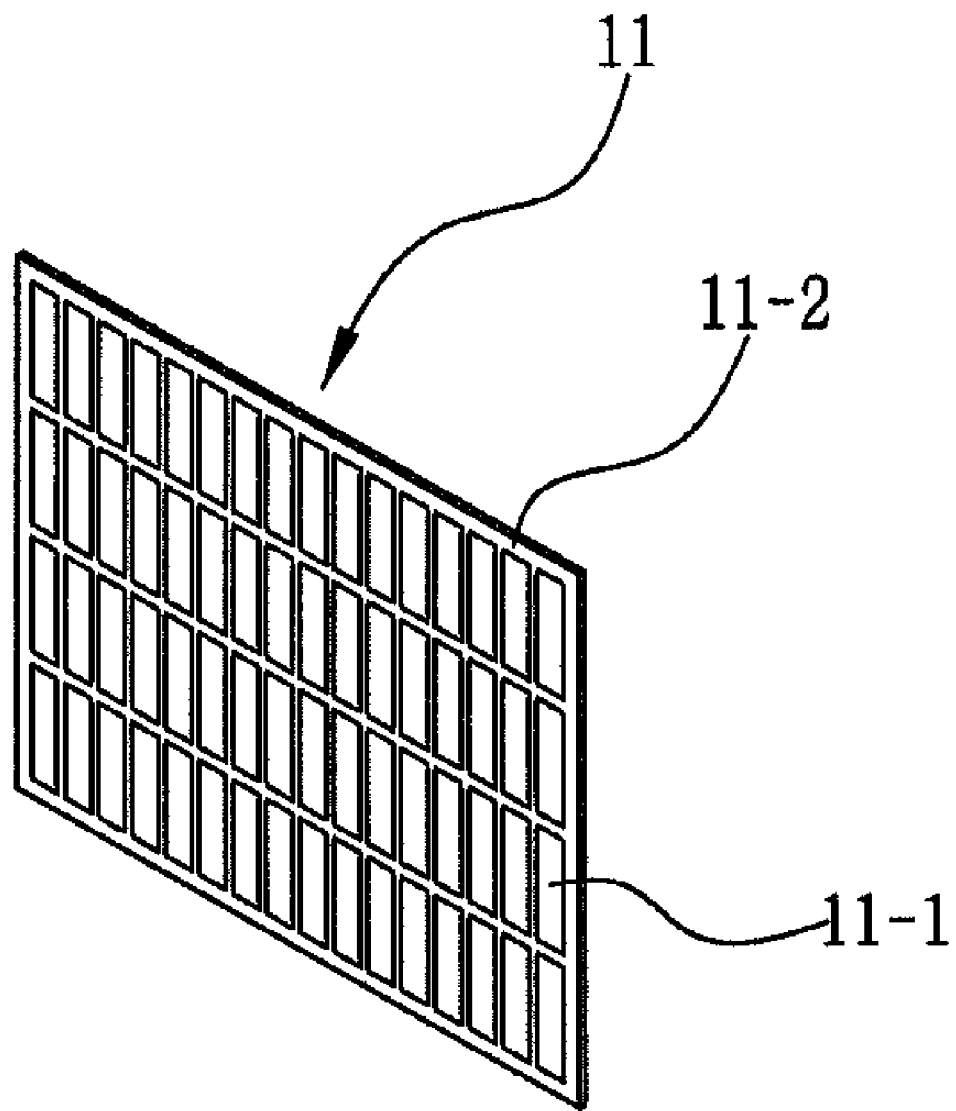
FIG. 4 offers a schematic perspective view of a test tray applied to a general test handler.
Figure 5:
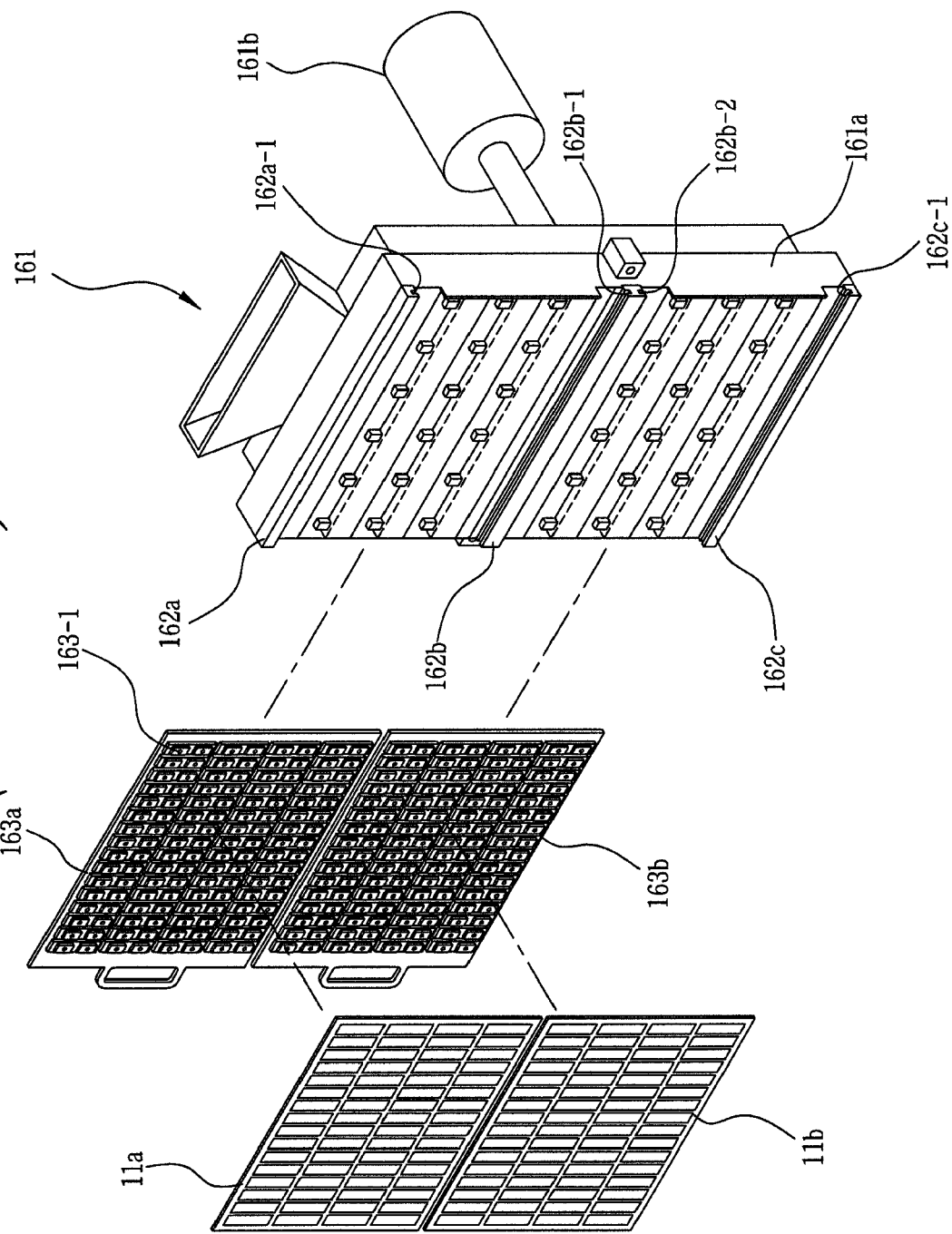
FIG. 5 presents an exploded perspective view showing major components of the test handler of FIG. 1.
Figure 6:
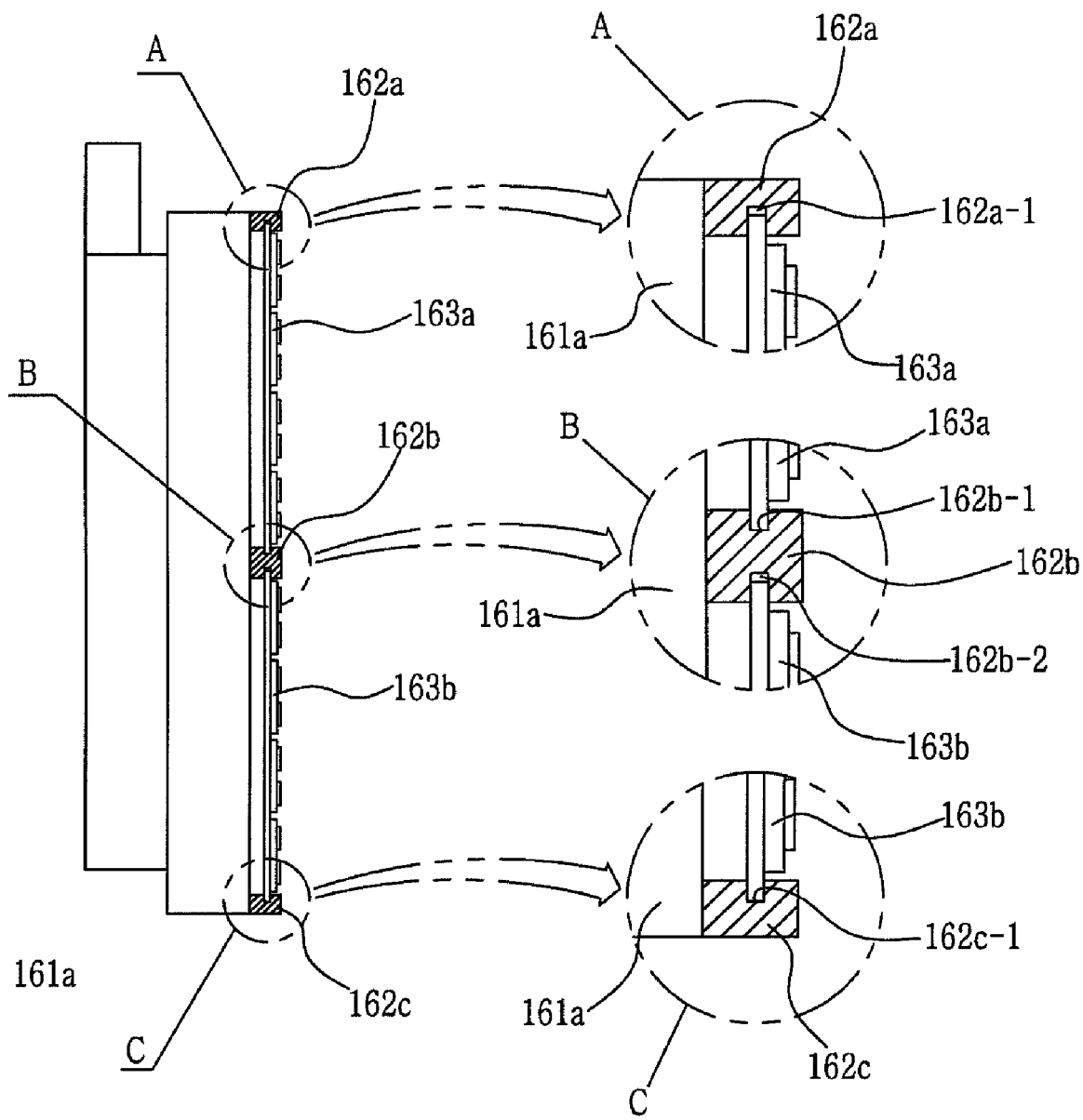
FIG. 6 depicts a side view showing major components of the test handler of FIG. 1.

Hereinafter, exemplary embodiments of the present invention will be described in detail with reference to the accompanying drawings. Here, as for the components of a test tray and a tester, the same reference numerals as assigned thereto in the description of the prior art will be employed, and redundant description thereof will be omitted or simplified.

First Embodiment

A test handler in accordance with a first embodiment of the present invention employs a mechanism for compensating a deviation between test trays and match plates by adjusting the positions of the match plates when deformations of test trays and the match plates occur due to thermal expansions or contractions thereof and when the deviation between them falls outside a tolerance range so that an appropriate connection between semiconductor devices held by the test tray and test sockets cannot be obtained.

Figure 10:
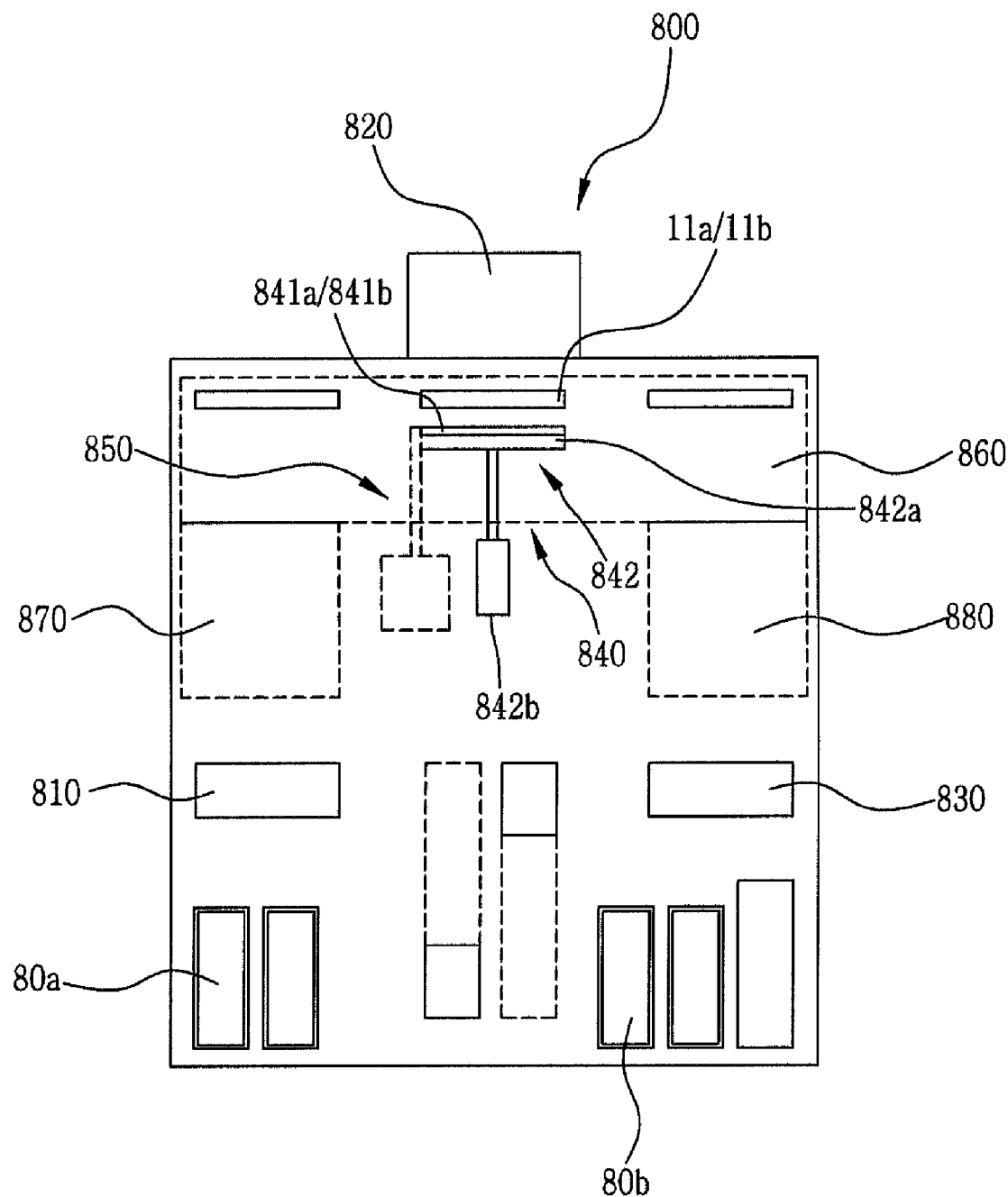
FIG. 10 is a conceptual top view showing major components of a test handler in accordance with a first embodiment of the present invention.

FIG. 10 is a conceptual top view of a test handler 800 in accordance with the first embodiment. The test handler 800 includes a loading unit 810, a soak chamber 870, a test chamber 860, a desoak chamber 880, an unloading unit 830, a pushing unit 840, a position control unit 850, and so forth. The loading unit 810 loads semiconductor devices onto a test tray from customer trays 80a.

The soak chamber 870 is installed to pre-heat or pre-cool the semiconductor devices after their loading is completed by the loading unit 810.

The test chamber 860 is installed to test the semiconductor devices loaded on the test tray transferred thereto via the soak chamber 870.

The desoak chamber 880 is installed to return the temperature of the semiconductor devices loaded on the test tray to the room temperature after their testing is completed by a tester 820.

The unloading unit 830 unloads the semiconductor devices loaded on the test trays transferred thereto via the desoak chamber 880 onto the customer trays 80b.

The pushing unit 840 includes match plates 841a and 841b being served as pushing members for pushing test trays 11a and 11b toward a tester 820 after they are brought into firm contact with the test trays 11a and 11b; and a press unit 842 for pushing the match plates 841a and 841b. The press unit 842 has a duct 842a and a cylinder 842b.

Further, the position control unit 850 adjusts a vertical position of the match plates 841a and 841b.

The pushing unit 840 and the position control unit 850 will be explained in further detail in connection with FIGS. 11, 12 and 13.

Figure 11:
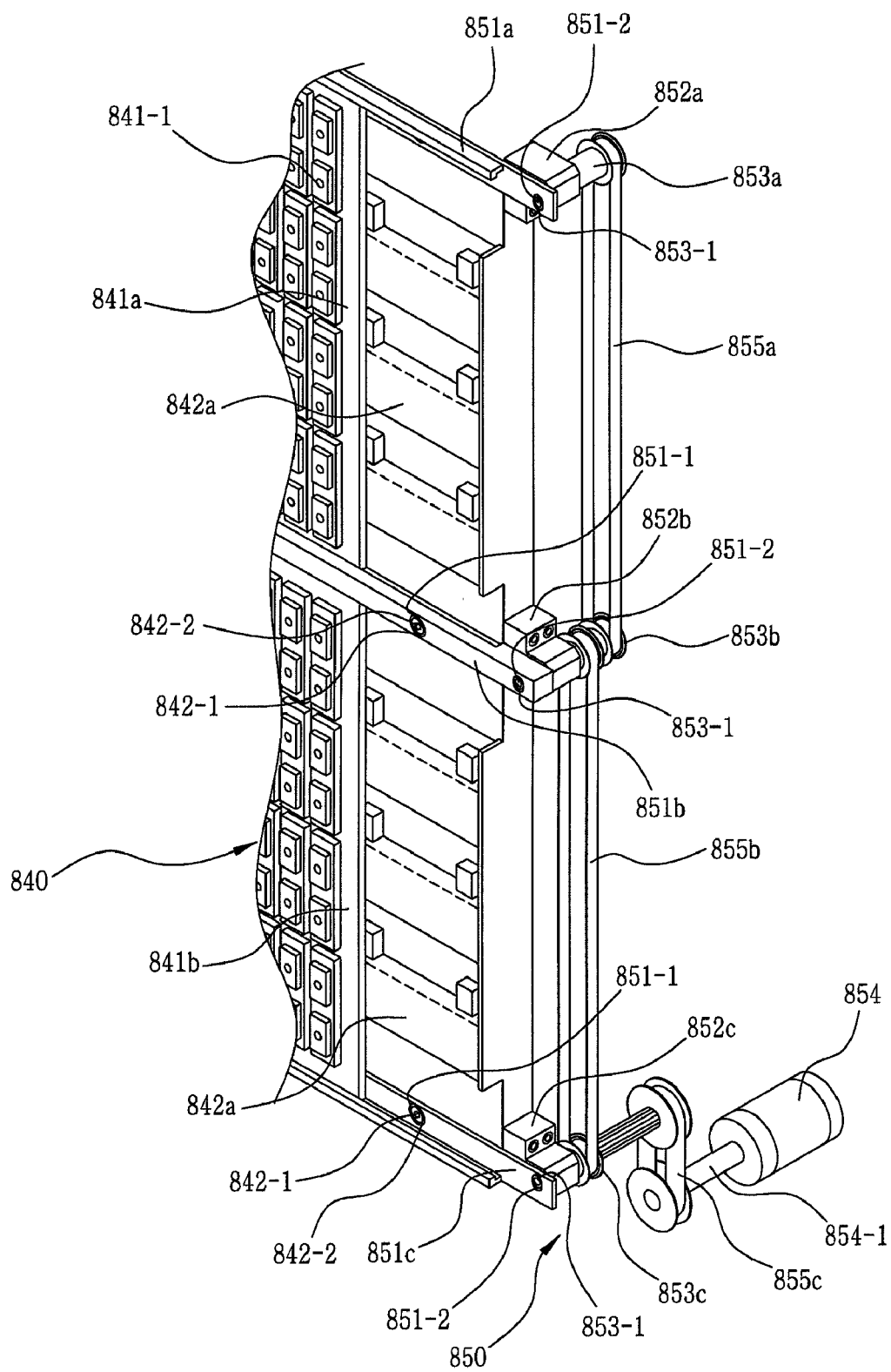
FIG. 11 sets forth a cutaway perspective view showing major components of the test handler of FIG. 10.

FIG. 11 is a cutaway perspective view showing major components of the test handler 800.

As shown in FIG. 11, the pushing unit 840 includes match plates 841a and 841b, a duct 842a, a cylinder 842b (see FIG. 10), and so forth.

The match plates 841a and 841b have a number of pushers 841-1 arranged in a matrix pattern. The pushers 841-1 are connected with inserts 11-1 of the test trays, while their positions are vertically adjusted by the position control unit 850. In FIG. 11, the match plates 841a and 841b are shown to be partially mounted.

The duct 842a serves to push the match plates 841a and 841b in a back-and-forth direction, and the cylinder 842b provides a power for moving the match plates 841a and 841b in the back-and-forth direction. The duct 842a has at least one protrusion 842-1 at each of its upper end portion, its middle portion and its lower end portion. The protrusions 842-1 are to be inserted into obliquely elongated holes 851-1 of guide rails 851a to 851c to be described later.

Further, bearings 842-2 are fitted to the protrusions 842 so that friction between the surfaces of the obliquely elongated holes 851-1 and the protrusions 842-1 can be minimized. Here, though the protrusions 842-1 can be formed at the duct 842a as one body therewith, it is preferable to form the protrusions with, e.g., screws for fastening the bearings 842-2 to the duct 842a in view of productivity. Further, it is also possible to design only the protrusions without the bearings 842-2. In FIG. 11, the obliquely elongated hole 851-1 of the upper guide rail 851a is hidden.

Further, as shown in FIG. 11, the position control unit 850 includes the guide rails 851a to 851c, coupling blocks 852a to 852c, pulleys 853a to 853c each having an eccentric cam 853-1, a motor 854, power transmission belts 855a to 855c, and so forth.

The guide rails 851a to 851c serve as supporting members for supporting the match plates 841a and 841b, and the obliquely elongated holes 851-1 into which the bearings 842-2 are to be inserted are formed at the guide rails 851a to 851c to correspond to the protrusions 842-1 in one-to-one correspondence. Further, a vertically elongated hole 851-2 is formed at one end of each of the guide rails 851a to 851c, wherein the eccentric cams 853-1 of the pulleys 853a to 853c are inserted into the vertically elongated holes 851-2. That is, the guide rails 851a to 851c have a coupling mechanism that allows them to be fastened to the duct 842a in a manner that changes of their positions are possible.

The coupling blocks 852a to 852c are interposed between the guide rails 851a to 851c and the pulleys 853a to 853c, and the coupling blocks 852a to 852c are fixed at the side surface of the duct 842a.

The pulleys 853a to 853c are rotatably connected to the coupling blocks 852a to 852c, respectively, and each of the pulleys 853a to 853c has the eccentric cam 853-1 at its front end. The eccentric cams 853-1 are inserted into the vertically elongated holes 851-2 of the guide rails 851a to 851c, respectively.

The motor 854 serves as a power source that supplies a power for rotating the pulleys 853a to 853c. Thus, ultimately, the motor 854 supplies a power for adjusting the vertical positions of the match plates 841a and 841b.

Among the power transmission belts 855a, 855b, 855c, the third power transmission belt 855c delivers the power from the motor 854 to the lower pulley 853c; the second power transmission belt 855b delivers the rotary force of the lower pulley 853c to the middle pulley 853b; and the first power transmission belt 855a delivers the rotary force of the middle pulley 853b to the upper pulley 853a. Thus, if the motor 854 is rotated, the upper, the middle and the lower pulleys 853a to 853c are rotated under being linked with the motor 854.

As described above, in the first embodiment of the present invention, the positions of the two upper and lower match plates 841a and 841b are adjusted together by the single motor 854. That is, by delivering the power generated from the single motor 854 to the plural match plates 841a and 841b, the plural match plates 841a and 841b can be configured to be moved together. Thus, it is possible to prevent a movement interference that can be generated in a configuration where the plural match plates are moved by individual power sources, and, also, a precise position control is enabled. In this aspect, the pulleys 853a to 853c, the power transmission belts 855a to 855c and the guide rails 851a to 851c serve as power transmission units for delivering the power generated from the single motor 854 to the two match plates 841a and 841b.

Figure 12:
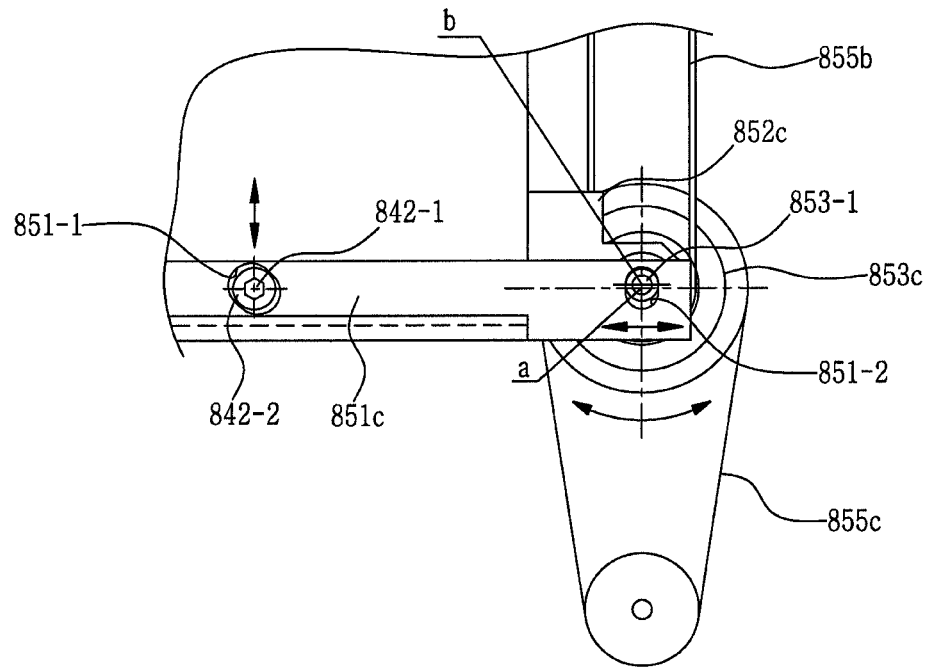
FIGS. 12 and 13 illustrate operational statuses of major components of the test handler of FIG. 10.
Figure 13:
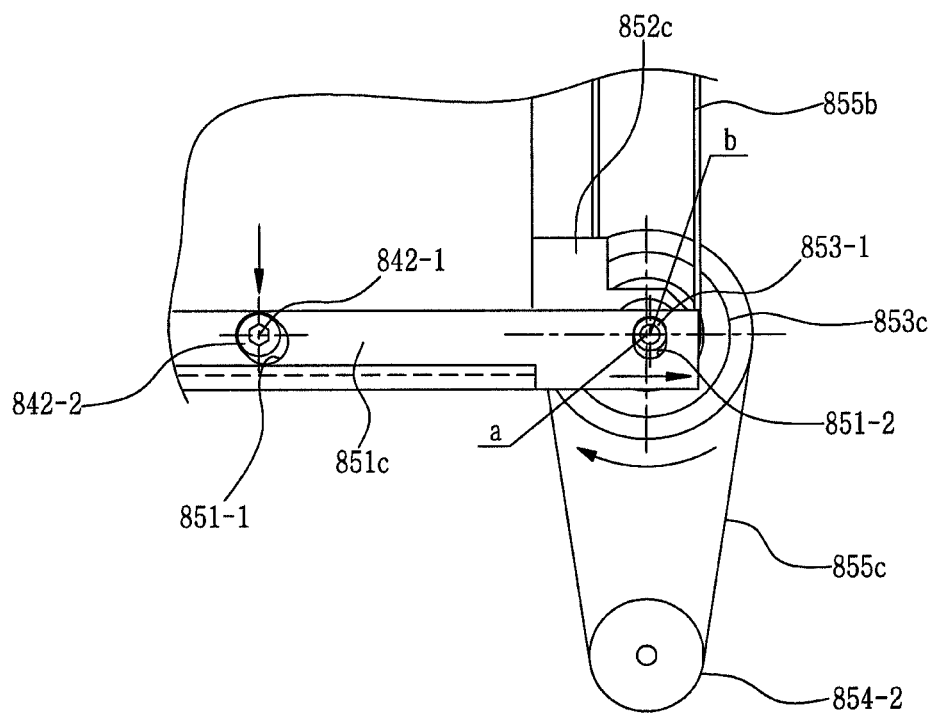
Figure 14:
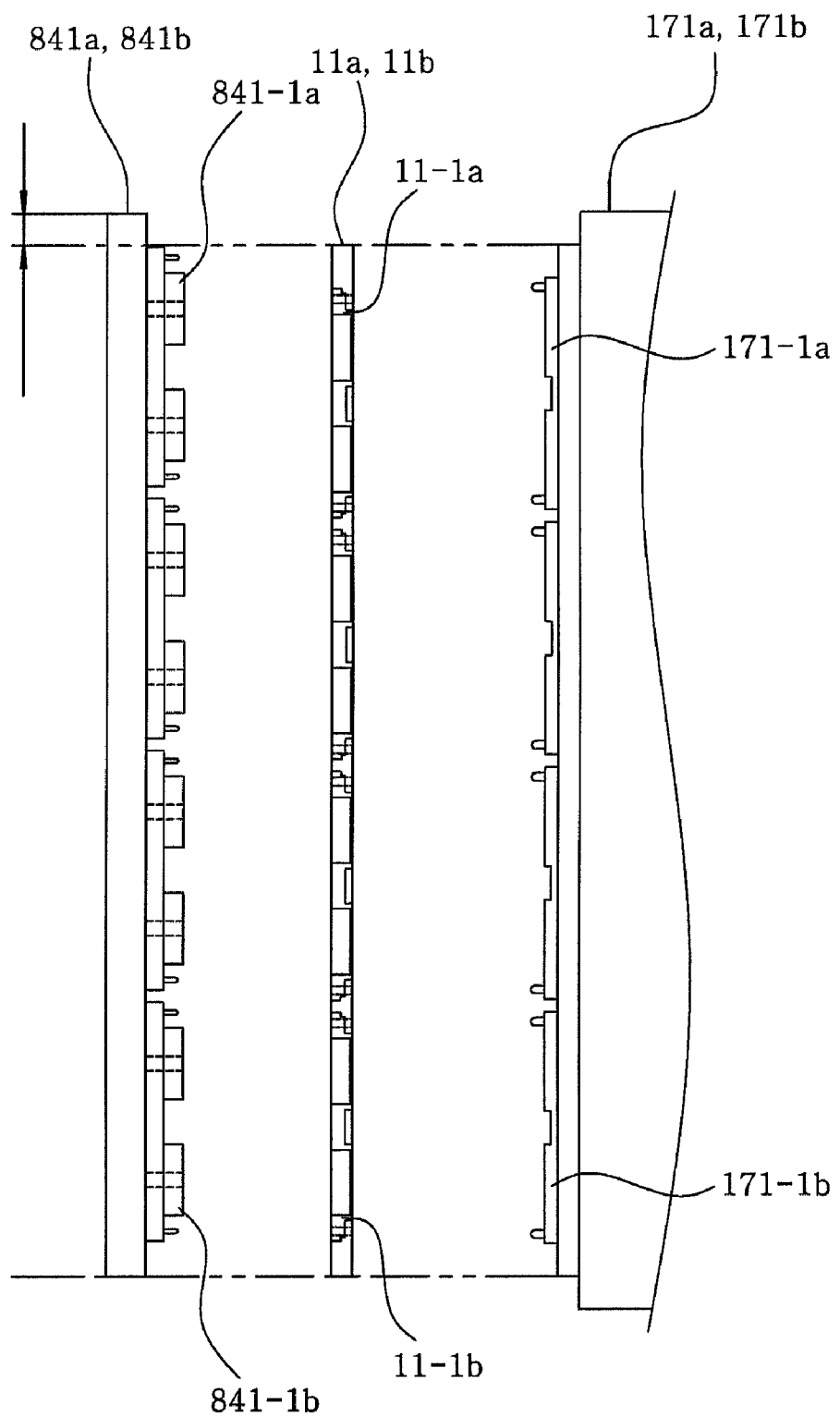
FIGS. 14 and 15 are drawings for describing results of operations of major components of FIG. 10.

Meanwhile, FIGS. 12 and 13 show major components in the vicinity of the lower guide rail 851c for the clear illustration of the first embodiment.

Each of FIGS. 12 and 13 shows a state in which a protrusion 842-1 provided at the duct 842a is inserted into an obliquely elongated hole 851-1 of the lower guide rail 851c with a bearing 842-2 intervened therebetween and, also, a state in which the eccentric cam 853-1 of the lower pulley 853c is inserted into the vertically elongated hole 851-2 of the lower guide rail 851c. That is, since a central point a of rotation of the lower pulley 853c and a central point b of the eccentric cam 853-1 are different, the eccentric cam 853-1 is made to be rotated in the rotational direction of the lower pulley 853c if the lower pulley 853c is rotated, while applying a left-and-right directional moving force to the lower guide rail 851c. Meanwhile, the protrusion 842-1, to which the bearing 842-2 is fitted, is installed at the duct 842a which has no movement in a left-and-right direction and an up-and-down direction. So, if the left-and-right directional moving force is applied to the lower guide rail 851c, the lower guide rail 851c is made to be moved in the left-and-right direction. Then, as a result of the left-and-right directional movement, the surface of an obliquedly elongated hole 851-1 is guided into the bearing while causing the up-and-down directional movement therewith. That is, if the lower pulley 853c is rotated, the lower guide rail 851c is made to be moved in the oblique direction. This operational principle is also applied to the upper and the middle guide rail 851a and 851b as well.

An operation of the test handler 800 having the above configuration will be described with reference to FIGS. 12, 13, 14 and 15. The description will be provided for an exemplary case where the match plates 841a and 841b undergo greater thermal expansion than the test trays 11a and 11b, and it is assumed herein that the test trays 11a and 11b and Hi-Fix boards 171a and 171b hardly suffer a thermal deformation for the simplicity of explanation.

Figure 7:
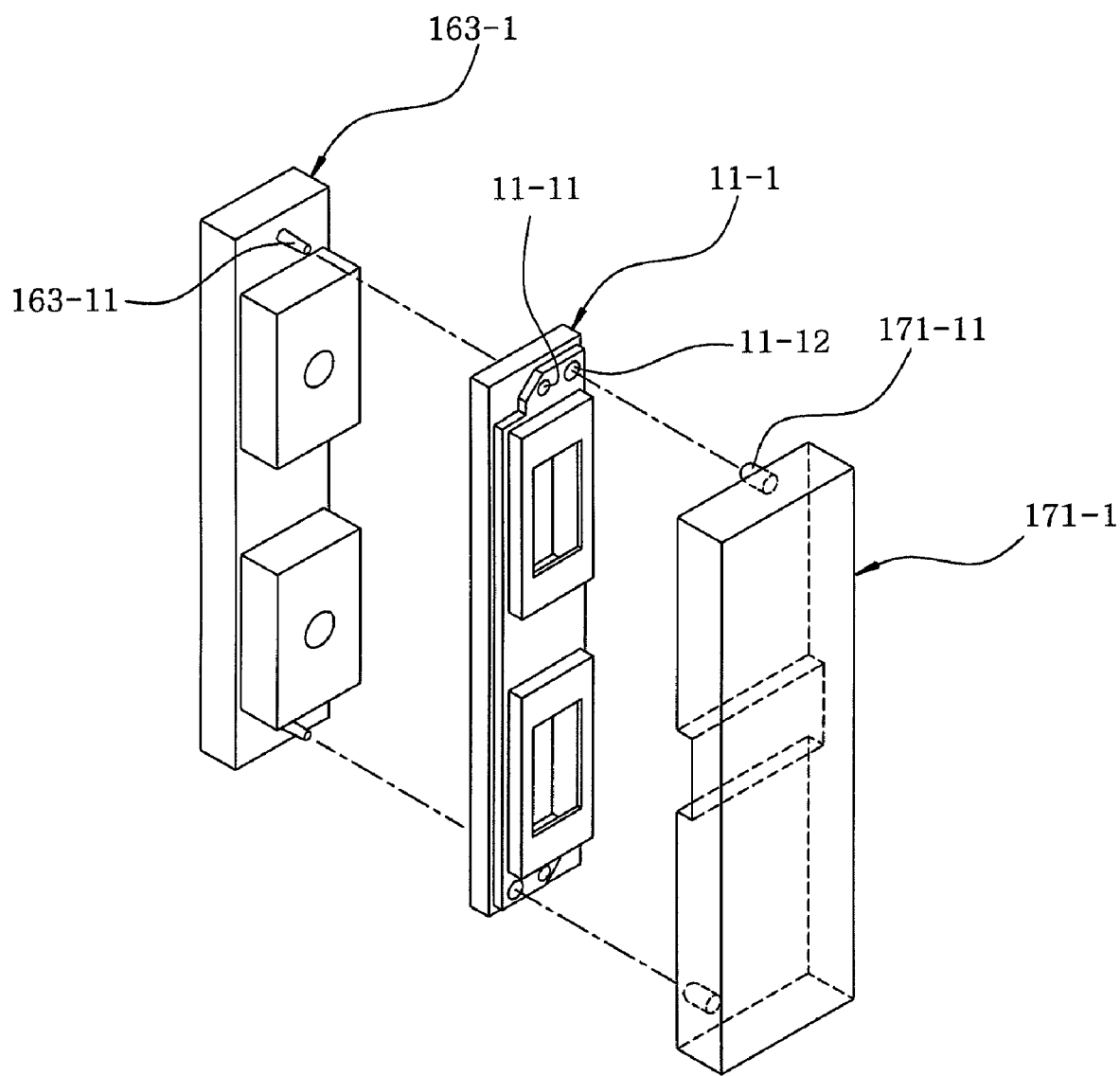
FIGS. 7 to 9 are drawings for describing problems of the test handler of FIG. 1.
Figure 8:
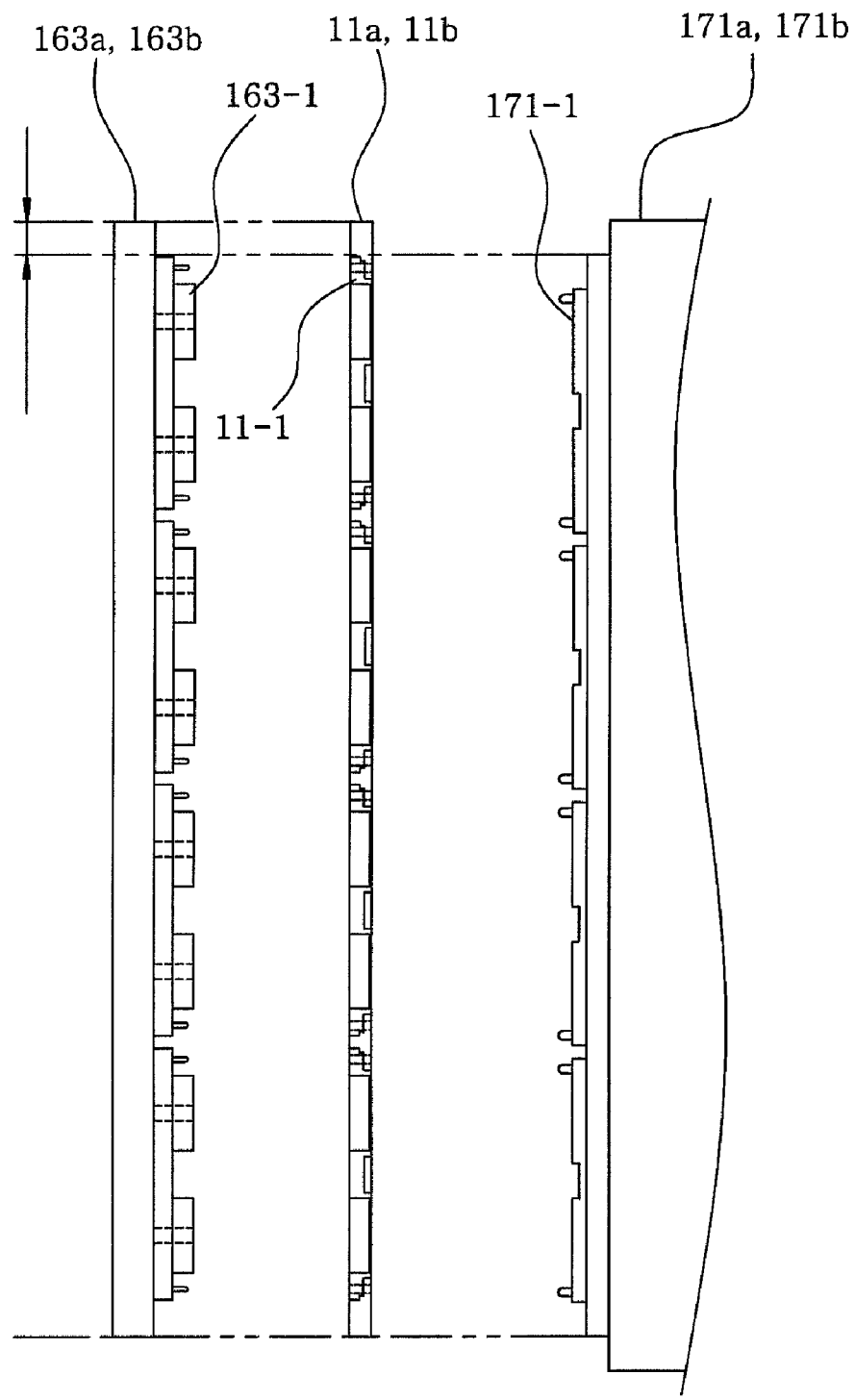
Figure 9:
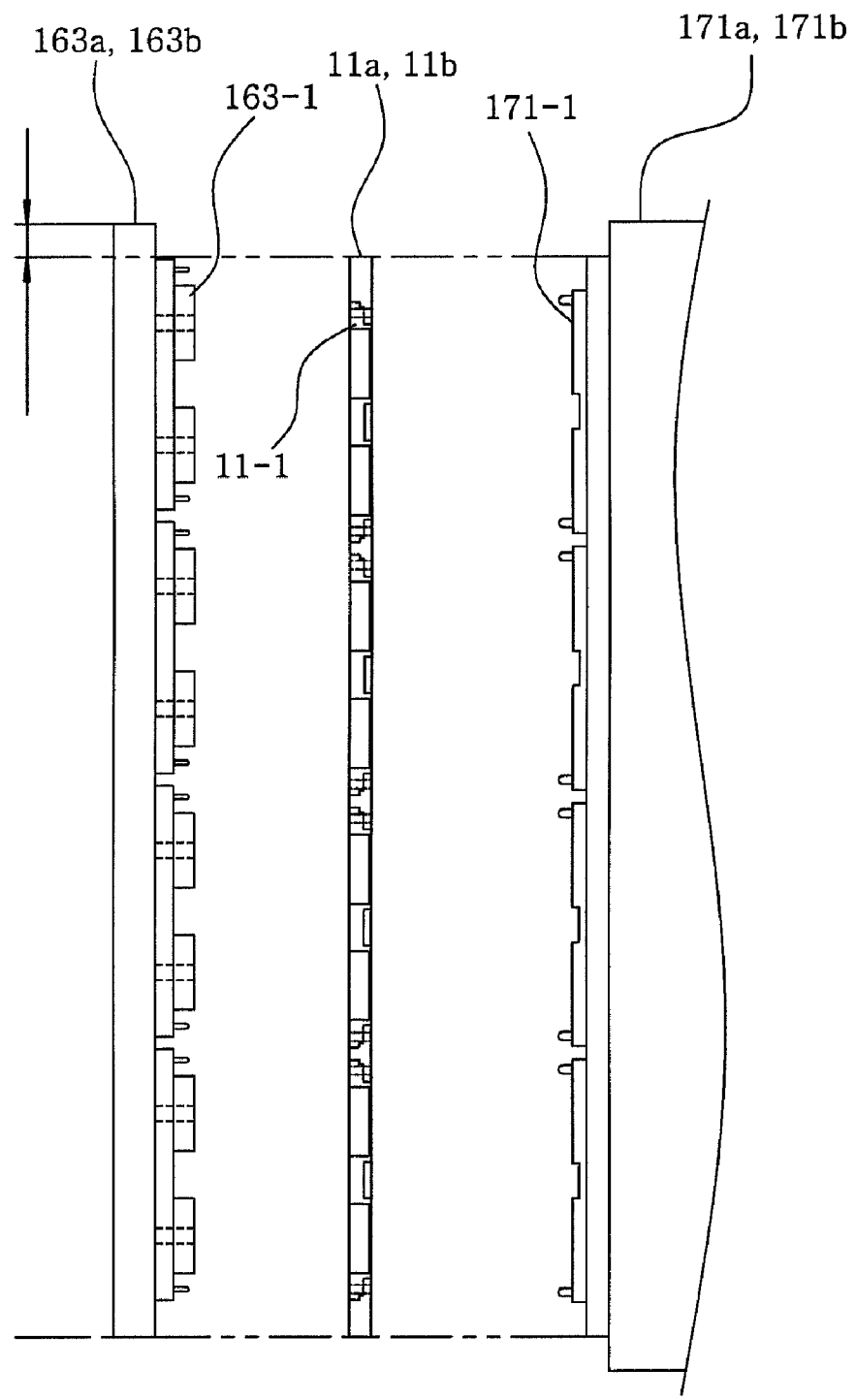

In case the test chamber 860 needs to be maintained at a high temperature, if the match plates 841a and 841b are mounted on the guide rails 851a to 851c in the state shown in FIG. 12, because the degree of the thermal expansions of the match plates 841a and 841b is greater than that of the test trays 11a and 11b, a firm adherence between the match plates 841a and 841b and the test trays 11a and 11b would not be allowed or even if the firm contact therebetween is possible an appropriate connection between the semiconductor devices loaded on the inserts 11-1 of the test trays 11a and 11b and the test sockets 171-1 of the Hi-fix boards 171a and 171b cannot be achieved. That is, as in the state shown in FIG. 14, though the positions of pushers 841-1b disposed at the lower portions of the match plates 841a and 841b coincide with the positions of inserts 11-1b located at the lower portions of the test trays 11a and 11b and test sockets 171-1b provided at the lower portions of the Hi-Fix boards 171a and 171b, the positions of pushers 841-1a disposed at the upper portions of the match plates 841a and 841b are deviated from their original positions, so that they cannot coincide with the positions of test sockets 171-1a provided at the upper portions of the Hi-Fix boards 171a and 171b. If the match plates 841a and 841b are installed in this state, the match plates 841a and 841b and the test trays 11a and 11b would not be firmly adhered to each other (especially, at their upper portions) or even if their firm adherence is possible, guide holes 11-12 (see FIG. 7) formed at the inserts 11-1 of the test trays 11a and 11b would not be appropriately matched with socket guiders 171-11 (see FIG. 7), resulting in damages of the inserts 11-1 or failures of the test sockets 171-1.

Figure 15:
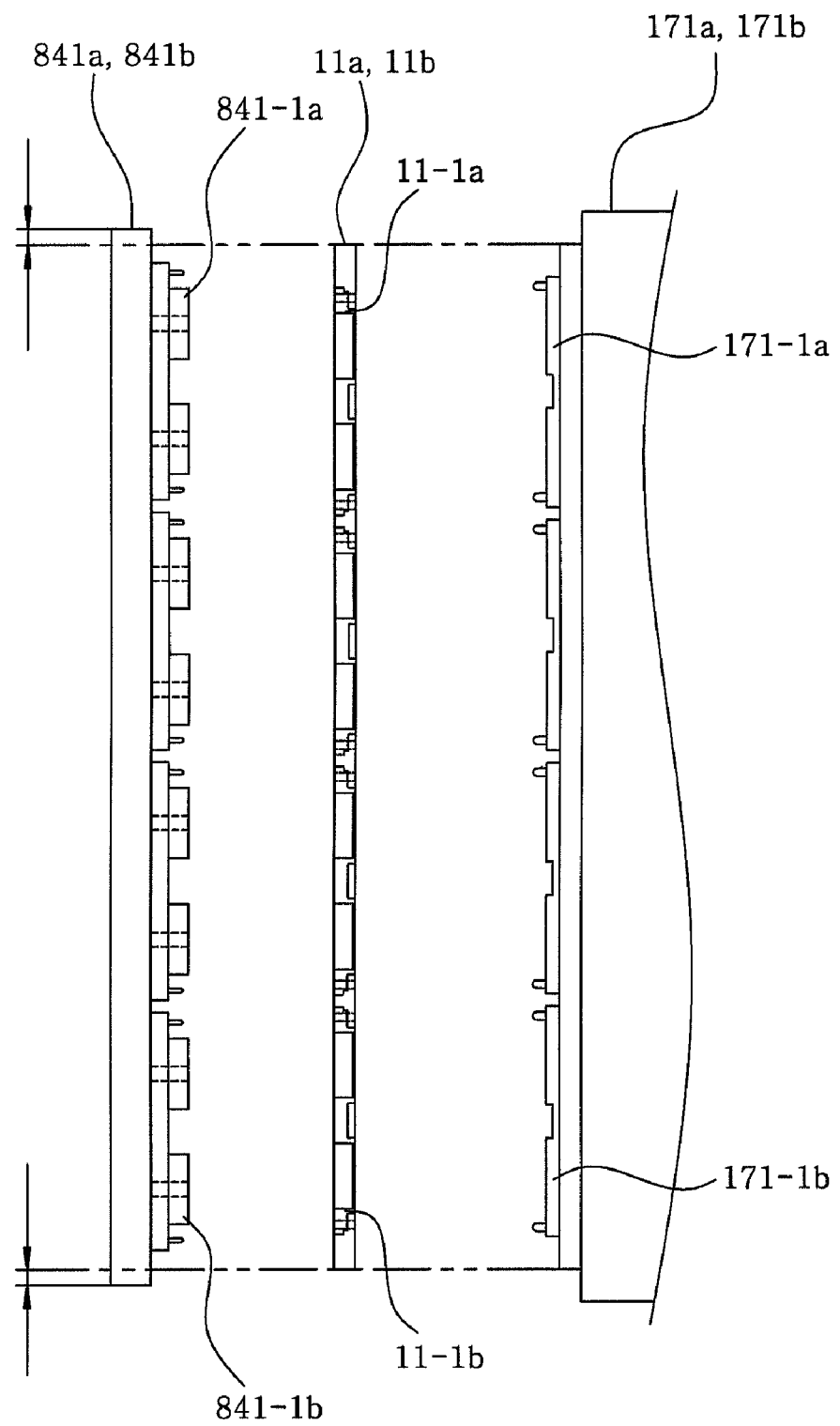

Accordingly, if the motor 854 is driven to rotate the pulleys 853a to 853c in a direction marked by a curved arrow in FIG. 13, the guide rails 851a to 851c are moved in directions marked by linear arrows in FIG. 13. Ultimately, the guide rails 851a to 851c are moved downward by a preset distance, thus allowing the match plates 841a and 841b to be installed as illustrated in FIG. 15. That is, referring to FIG. 15, though the positions of the pushers 841-1b disposed at the lower portions of the match plates 841a and 841b are deviated from the positions of the inserts 11-1b located at the lower portions of the test trays 11a and 11b and the test sockets 171-1b provided at the lower portions of the Hi-Fix boards 171a and 171b, the deviation falls within a tolerance range, so that an appropriate connection between the semiconductor devices loaded in the inserts 11-1b and the test sockets 171-1b can be achieved. Furthermore, since the deviation of the positions of the pushers 841-1a disposed at the upper portions of the match plates 841a and 841b from the positions of the inserts 11-1a located at the upper portions of the test trays 11a and 11b and the test sockets 171-1a provided at the upper portions of the Hi-Fix boards 171a and 171b is reduced, an appropriate connection between the semiconductor devices loaded in the inserts 11-1a and the test sockets 171-1a can be achieved.

In case thermal contractions of the match plates 841a and 841b are greater than those of the test trays 11a and 11b, an appropriate connection between the semiconductor devices and the test sockets 171-1 can be achieved by performing the reverse operation as described above.

Second Embodiment

Though a second embodiment of the present invention is based on the same principle as that of the first embodiment, it differs from the first embodiment in that an appropriate connection between semiconductor devices held by test tray and test sockets is achieved by adjusting the positions of the test trays, not the match plates. Here, it is assumed that the match plates do not undergo thermal deformation but only the test trays suffer thermal expansion or contraction for the simplicity of the explanation.

Figure 16:
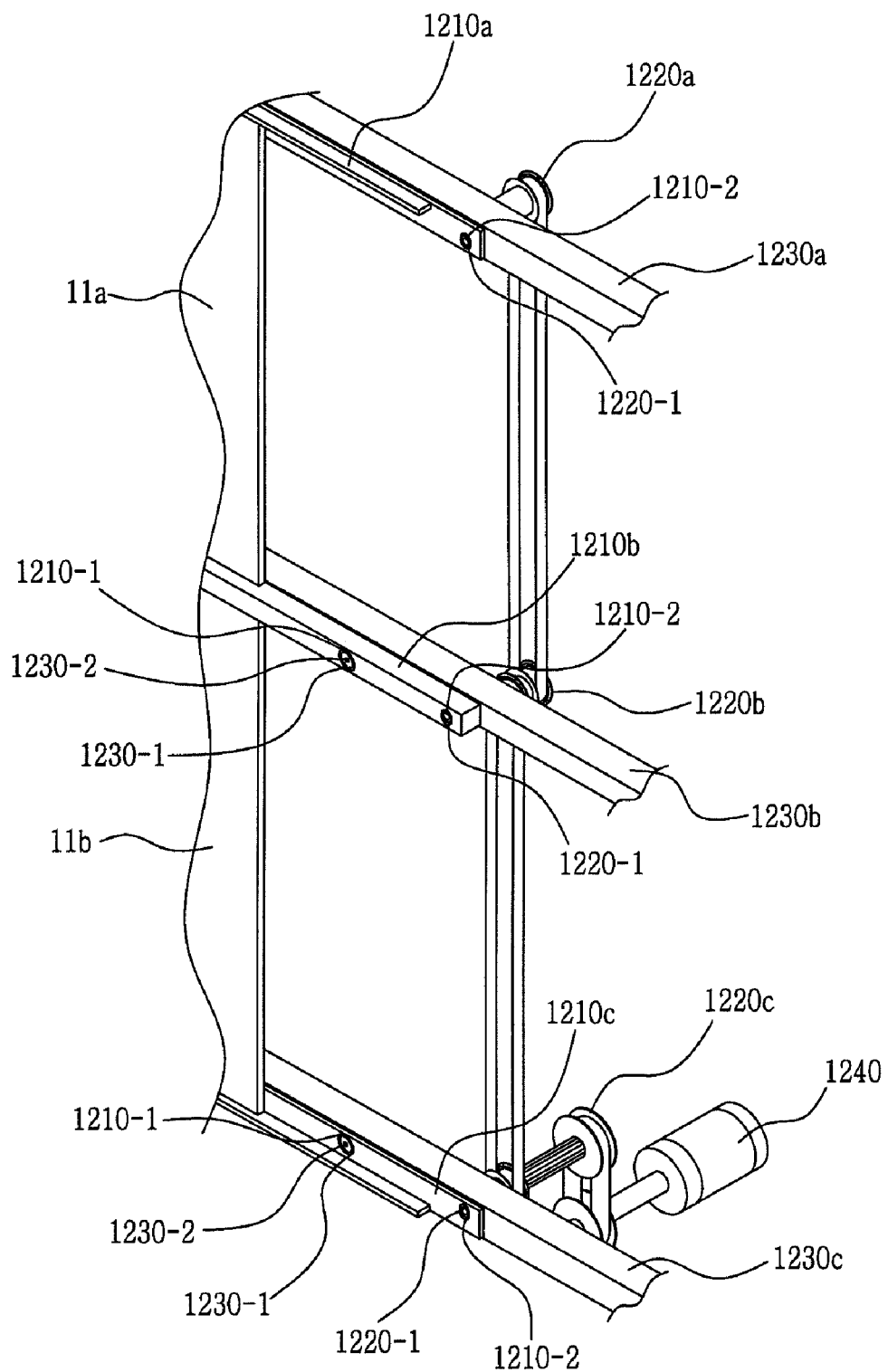
FIG. 16 provides a cutaway perspective view showing major components of a test handler in accordance with a second embodiment of the present invention.

Referring to FIG. 16, each of move rails 1210a to 1210c serving as movement guide members and support members of test trays 11a and 11b is provided with an obliquely elongated hole 1210-1 and a vertically elongated hole 1210-2. Further, pulleys 1220a to 1220c are rotatably installed at coupling members 1230a to 1230c, respectively, wherein each pulley has an eccentric cam 1220-1 inserted into corresponding one of the vertically elongated holes 1210-2.

Each of the coupling members 1230a to 1230c is provided with a protrusion 1230-2 inserted into corresponding one of the obliquely elongated holes 1210-1 with a bearing 1230-1 intervened therebetween. In FIG. 16, only halves of the test trays 11a and 11b are shown to be inserted along the move rails 1210a to 1210c and the obliquely elongated hole 1210-1 of the upper move rail 1210a is shown to be hidden.

In the second embodiment illustrated in FIG. 16, if a motor 1240 is rotated, the move rails 1210a to 1210c are made to be moved obliquely, while adjusting the positions of the test trays 11a and 11b supported by them.

Though the first and the second embodiments have been described by assuming that the test trays (in the first embodiment) or the match plates (in the second embodiment) do not undergo thermal deformation, both of the test trays and the match plates would be thermally deformed in substantial. Since the inserts on the test tray are supported by a frame while having gaps in all directions from the frame, it is preferable to employ the first embodiment in which pushers at the upper and the lower portions of the match plates are configured to be matched with test sockets at the upper and the lower portions of the Hi-Fix boards within a tolerance range. However, when considering generation of deviations in various ranges depending on the materials of the match plates and the test trays and the temperature conditions, it is more preferable to embody a test handler employing both the first and the second embodiment.

Further, though the first and the second embodiment have been described for the case of using a motor to control the positions of the match plates or the test trays, it is also possible to move the guide rails or the move rails manually by an operator and then fix them at the moved positions by using fastening means. In such a case, the position control unit can be configured to only include the guide rails or the move rails. Besides these examples, various modifications can be made in adjusting the positions of the match plates or the test trays. For example, the match plates or the test trays can be moved by using racks and pinions.

In accordance with the embodiments of the present invention, by adjusting the positions of at least one of the test trays or the match plates, an appropriate connection between the semiconductor devices held by the test trays and the test sockets of the Hi-Fix boards can be achieved.

While the invention has been shown and described with respect to the exemplary embodiments, it will be understood by those skilled in the art that various changes and modification may be made without departing from the spirit and scope of the invention as defined in the following claims.

What is claimed is:

1. A test handler comprising:
a loading unit configured to load semiconductor devices from customer trays onto a test tray including a number of inserts arranged in a matrix pattern;
a test chamber configured to perform a test for the semiconductor devices loaded on the test tray;
a pushing unit having at least one match plate configured to push the test tray located in the test chamber, at least a pair of lower support member and upper support member movably mounted to the pushing unit, respectively, and a press unit configured to operate the match plate, the match plate having a number of pushers arranged in a matrix pattern to correspond to the inserts arranged in the matrix pattern on the test tray, and the match plate being slidably mounted between the lower support member and the upper support member with a gap between an upper end of the match plate and the upper support member;
a position control unit configured to adjust a position of the match plate to compensate a vertical deviation between the match plate and the test tray; and
an unloading unit configured to unload the semiconductor devices loaded on the test tray onto the customer trays after a test for the semiconductor devices is completed,
wherein the vertical deviation is caused by a thermal expansion or contraction of any one of the match plate and the test tray; and
wherein the position control unit moves the lower support member to adjust a position of the match plate to compensate for the vertical deviation, thereby allowing the positions of the pushers and the inserts to be coincided with each other for the test.

2. The test handler of claim 1, wherein the lower support member has a coupling configuration configured to couple the lower support member to the press unit while allowing a position variation of the lower support member.

3. The test handler of claim 2, wherein the coupling configuration includes at least one obliquely elongated hole provided at the lower support member; and at least one protrusion provided at the press unit to be inserted into the obliquely elongated hole, and the lower support member and the press unit are coupled to each other by way of inserting the protrusion into the obliquely elongated hole.

4. The test handler of claim 1, wherein the position control unit includes a driving unit configured to supply a power required to adjust the position of the match plate, and wherein the driving unit includes a power source configured to generate the power and a power transmission unit configured to deliver the power from the power source to the lower support member.

5. A test handler comprising:

a loading unit configured to load semiconductor devices from customer trays onto a test tray including a number of inserts arranged in a matrix pattern;

a test chamber configured to perform a test for the semiconductor devices loaded on the test tray;

a pushing unit having at least one match plate configured to push the test tray located in the test chamber to be tested, and at least a pair of lower support member and upper support member mounted to the pushing unit, respectively, the match plate having a number of pushers arranged in a matrix pattern to correspond to the inserts arranged in the matrix pattern on the test tray, and the match plate being slidably mounted between the lower support member and the upper support member with a gap between an upper end of the match plate and the upper support member;

a position control unit configured to adjust a position of the test tray to compensate a vertical deviation between the match plate and the test tray; and an unloading unit configured to unload the semiconductor devices loaded on the test tray onto the customer trays after a test of the semiconductor devices is completed, wherein the vertical deviation is caused by a thermal expansion or contraction of any one of the match plate and the test tray;

wherein the position control unit includes at least one move rail movably mounted to the test tray to guide and support the test tray and moves the move rail to adjust a position of the test tray to compensate for the vertical deviation, thereby allowing the positions of the pushers and the inserts to be coincided with each other for the test;

wherein the move rail has a coupling configuration configured to couple the move rail to the test tray while allowing a position variation of the move rail; and wherein the coupling configuration includes at least one obliquely elongated hole provided at the move rail; and at least one protrusion provided at the test tray to be inserted into the obliquely elongated hole, and the move rail member and the test tray are coupled to each other by way of inserting the protrusion into the obliquely elongated hole.

6. The test handler of claim 5, wherein the position control unit further includes a driving unit configured to supply a power required to adjust the position of the test tray, and wherein the driving unit includes a power source configured to generate the power and a power transmission unit configured to deliver the power from the power source to the move rail.

* * * * *